US006246234B1

United States Patent
Yokotani et al.

(10) Patent No.: US 6,246,234 B1
(45) Date of Patent: *Jun. 12, 2001

(54) MAGNETIC DETECTOR WITH IMPROVED TEMPERATURE CHARACTERISTIC AND NOISE RESISTANCE

(75) Inventors: Masahiro Yokotani; Izuru Shinjo; Yasuyoshi Hatazawa, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/175,413

(22) Filed: Oct. 20, 1998

(30) Foreign Application Priority Data

May 8, 1998 (JP) ................................................. 10-126281

(51) Int. Cl.⁷ .............................. G01B 7/30; G01P 3/481; G01R 33/09; G01D 5/14
(52) U.S. Cl. ............... 324/207.21; 324/174; 324/207.12; 324/252
(58) Field of Search ......................... 324/207.12, 207.21, 324/207.25, 173, 174, 252; 338/32 R

(56) References Cited

U.S. PATENT DOCUMENTS

| 4,506,217 | * | 3/1985 | Rothley et al. | 324/207.21 |
| 4,712,064 | * | 12/1987 | Eckardt et al. | 324/252 X |
| 5,644,226 | * | 7/1997 | Aoyama et al. | 324/207.21 |
| 5,789,919 | * | 8/1998 | Umemoto et al. | 324/252 X |
| 5,841,276 | * | 11/1998 | Makino et al. | 324/207.21 |

FOREIGN PATENT DOCUMENTS

| 3426 784 | 1/1986 | (DE) . |
| 196 80 089 | 4/1997 | (DE) . |
| 196 47 320 | 12/1997 | (DE) . |
| 197 38 361 | 8/1998 | (DE) . |

OTHER PUBLICATIONS

"Magnetoresistance Effect of Artificial Lattice", Journal of the Applied Magnetism Society of Japan, vol. 15, No. 51991, pp. 813–820.

* cited by examiner

Primary Examiner—Gerard R. Strecker
(74) Attorney, Agent, or Firm—Sughrue, Mion, Zinn, Macpeak & Seas, PLLC

(57) ABSTRACT

Disclosed is a magnetic detector in which a GMR device is operated within the limited range of a magnetic field so as to optimize a temperature characteristic of changes in resistance value and to improve noise resistance. The magnetic detector comprises a magnet (4) for generating a magnetic field, a rotary member (2) of magnetic material arranged with a predetermined gap left relative to the magnet and provided with projections capable of changing the magnetic field generated by the magnet, and a giant magnetoresistance device (3) of which resistance value is changed depending on the magnetic field changed by the rotary member of magnetic material. The giant magnetoresistance device is arranged to have such a predetermined gap relative to the magnet that the giant magnetoresistance device operates under a magnetic field applied to change in a predetermined amplitude range, e.g., 50~150 [Oe], where a temperature characteristic of resistance change rate of the giant magnetoresistance device is small.

4 Claims, 7 Drawing Sheets

MR CHARACTERISTIC

TEMPERATURE CHARACTERISTIC OF APPLIED MAGNETIC FIELD – RESISTANCE CHANGE RATE

PROJECTION ⌐⌐
RECESS    ⌎⌍

APPLIED
MAGNETIC
FIELD

OUTPUT OF
DIFFERENTIAL
AMPLIFICATION
CIRCUIT

OUTPUT OF
WAVEFORM
SHAPING
CIRCUIT

FIG. 10A PROJECTION
RECESS

FIG. 10B OUTPUT OF DIFFERENTIAL AMPLIFICATION CIRCUIT

FIG. 10C OUTPUT OF WAVEFORM SHAPING CIRCUIT

MAGNETIC DETECTOR WITH IMPROVED TEMPERATURE CHARACTERISTIC AND NOISE RESISTANCE

BACKGROUND OF THE INVENTION

1. Field of the Invention

The present invention relates to a magnetic detector for detecting changes of an applied magnetic field, and more particularly to a magnetic detector suitable for detecting, e.g., rotation information of an internal combustion engine.

2. Description of the Related Art

Generally, a giant magnetoresistance device (referred to as a GMR device hereinafter) is the so-called artificial lattice film, i.e., a laminate manufactured by alternately forming a magnetic layer and a non-magnetic layer one above the other in thickness of several angstroms to several tens angstroms, as described in "Magnetoresistance Effect of Artificial Lattice", Journal of Applied Magnetism Society of Japan, Vol. 15, No. 51991, pp. 813–821. Such known artificial lattice films are represented by (Fe/Cr)n, (Permalloy/Cu/Co/Cu)n, and (Co/Cu)n. The GMR device exhibits a much greater MR effect (MR change rate) than a conventional magnetoresistance device (referred to as an MR device hereinafter). Also, the GMR device is the so-called in-plane magnetic sensitive device of which MR effect depends on only a relative angle between the directions of magnetization of the magnetic layers adjacent each other, and which produces the same changes in resistance value regardless of any angular difference in direction of an external magnetic field with respect to a current.

In this respect, there is known a technique for detecting changes of a magnetic field as follows. Magnetic sensitive surfaces are formed by GMR devices, and electrodes are provided at both ends of each magnetic sensitive surface to form a bridge circuit. A constant-voltage and constant-current power supply is connected between two opposing electrodes of the bridge circuit so that changes in resistance value of the GMR devices are converted into voltage changes, thereby detecting changes of the magnetic field acting on the GMR devices.

FIG. 7 is a view showing a construction of a conventional magnetic detector using a typical GMR device as mentioned above; FIG. 7A is a side view and FIG. 7B is a plan view.

The conventional magnetic detector comprises a rotary member of magnetic material (referred to as a plate hereinafter) 2 which has projections capable of changing a magnetic field and is rotated in synch with a rotary shaft 1, a GMR device 3 arranged with a predetermined gap relative to the plate 2, and a magnet 4 for applying a magnetic field to the GMR device 3. The GMR device 3 has magnetoresistance patterns 3a, 3b formed in its magnetic sensitive surface. Furthermore, the GMR device 3 is attached in place by a fixing member (not shown) of non-magnetic material with a predetermined gap relative to the magnet 4.

In the above construction, when the plate 2 rotates, the magnetic field applied to the GMR device 3 is changed and so does a resistance value of each magnetoresistance pattern 3a, 3b.

FIG. 8 is a block diagram of a circuit configuration of a conventional magnetic detector.

The conventional magnetic detector comprises a Wheatstone bridge circuit 11 using GMR devices which are arranged with a predetermined gap relative to a plate 2 and are subject to a magnetic field applied from a magnet 4, a differential amplification circuit 12 for amplifying an output of the Wheatstone bridge circuit 11, a comparison circuit 13 for comparing an output of the differential amplification circuit 12 with a reference value, and a waveform shaping circuit 14 for receiving an output of the comparison circuit 13 and outputting a signal having a level "0" or "1" to an output terminal 15.

FIG. 9 shows one specific example of the circuit configuration represented by the block diagram of FIG. 8.

The Wheatstone bridge circuit 11 includes GMR devices 10A, 10B, 10C and 10D which are each disposed, by way of example, in one side of a bridge. One ends of the GMR devices 10A and 10C are interconnected at a junction point 16 which is connected to a power source terminal Vcc, while one ends of the GMR devices 10B and 10D are interconnected at a junction point 17 which is grounded. The other ends of the GMR devices 10A and 10B are interconnected at a junction point 18, while the other ends of the GMR devices 10C and 10D are interconnected at a junction point 19.

The junction point 18 of the Wheatstone bridge circuit 11 is connected to an inverted input terminal of an amplifier 12a in the differential amplification circuit 12 through a resistor. The junction point 19 is connected to a non-inverted input terminal of the amplifier 12a through a resistor and also connected through a resistor to a voltage dividing circuit which constitutes a reference power supply.

Further, an output terminal of the amplifier 12a is connected to an inverted input terminal of the comparison circuit 13. A non-inverted input terminal of the comparison circuit 13 is connected to a voltage dividing circuit which constitutes a reference power supply, and also connected to an output terminal thereof through a resistor.

An output terminal of the comparison circuit 13 is connected to the power source terminal Vcc through a resistor, and a base of a transistor 14a in the waveform shaping circuit 14. A collector of the transistor 14a is connected to the output terminal 15 and also connected to the power source terminal Vcc through a resistor, whereas an emitter of the transistor 14a is grounded.

The operation of the above magnetic detector will be described below with reference to FIG. 10.

When the plate 2 rotates, the GMR devices 10A and 10D of the Wheatstone bridge circuit 11 are subject to the same changes of a magnetic field, and the GMR devices 10B and 10C thereof are subject to the changes of a magnetic field which are the same to each other, but different from the changes of a magnetic field applied to the GMR devices 10A and 10D, corresponding to projections and recesses of the plate 2 shown in FIG. 10A. As a result, resistance values of the pairs of GMR devices 10A, 10D; 10B, 10C are changed corresponding to the projections and recesses of the plate 2 such that the resistance values are maximized and minimized in reversed positional relation. Middle point voltages at the junctions 18, 19 of the Wheatstone bridge circuit 11 are also changed likewise.

Then, a difference between the middle point voltages is amplified by the differential amplification circuit 12 and, as shown in FIG. 10B, an output $V_{Do}$ indicated by a solid line is produced at the output terminal of the differential amplification circuit 12 corresponding to the projections and recesses of the plate 2 shown in FIG. 10A.

The output of the differential amplification circuit 12 is supplied to the comparison circuit 13 and compared with a comparison level, i.e., a reference value $V_{TH}$. A comparison signal is shaped in waveform by the waveform shaping circuit 14. Consequently, an output having a level "0" or "1", indicated by a solid line in FIG. 10C, is obtained at the output terminal 15.

In the conventional magnetic detector, however, a large gain cannot be achieved because changes in resistance value of each GMR device are reduced due to the temperature coefficient of the resistance value of the GMR device. Accordingly, there has been a problem that the conventional magnetic detector is easily affect ed by noise and has lower noise resistance.

SUMMARY OF THE INVENTION

With a view of solving the problems set forth above, an object of the present invention is to provide a magnetic detector in which a GMR device is operated within the limited range of a magnetic field so as to optimize a temperature characteristic of changes in resistance value and to improve noise resistance.

A magnetic detector according to a first aspect of the present invention comprises magnetic field generating means for generating a magnetic field, a rotary member of magnetic material arranged with a predetermined gap relative to the magnetic field generating means and provided with projections capable of changing the magnetic field generated by the magnetic field generating means, and a giant magnetoresistance device of which resistance value is changed depending on the magnetic field changed by the rotary member of magnetic material, the giant magnetoresistance device being arranged to have such a predetermined gap relative to the magnetic field generating means that the giant magnetoresistance device operates under a magnetic field applied to change in a predetermined amplitude range where a temperature characteristic of resistance change rate of the giant magnetoresistance device is small.

According to a second aspect of the present invention, in the above magnetic detector of the first aspect, the predetermined amplitude range of the applied magnetic field is 50–150 [Oe].

According to a third aspect of the present invention, in the above magnetic detector of the first aspect, the giant magnetoresistance has first and second magnetoresistance patterns to form a bridge circuit, the first magnetoresistance pattern being arranged to have such a predetermined gap relative to the magnetic field generating means that the first magnetoresistance pattern operates under a magnetic field applied to change in a first predetermined amplitude range where the temperature characteristic of resistance change rate of the giant magnetoresistance device is small, the second magnetoresistance pattern being arranged to have such a predetermined gap relative to the magnetic field generating means that the second magnetoresistance pattern operates under a magnetic field applied to change in a second predetermined amplitude range where the temperature characteristic of resistance change rate of the giant magnetoresistance device is small.

According to a fourth aspect of the present invention, in the above magnetic detector of the third aspect, the first predetermined amplitude range of the applied magnetic field is 50–150 [Oe], and the second predetermined amplitude range of the applied magnetic field is -150~-50 [Oe].

BRIEF DESCRIPTION OF THE DRAWINGS

FIGS. 10A to 10C are waveform charts for explaining the operation of the circuit shown in FIG. 9.

DESCRIPTION OF THE PREFERRED EMBODIMENTS

Preferred embodiments of a magnetic detector according to the present invention will be described below with reference to the drawings.
Embodiment 1

A construction, circuit block diagram, specific circuit configuration, and operation of a magnetic detector according to Embodiment 1 of the present invention are the same as those of the conventional magnetic detector except later-described arrangement of a magnetoresistance pattern of a GMR device relative to a magnet, and the description thereof is omitted here in detail.

In this Embodiment 1, a magnetoresistance pattern formed in a magnetic sensitive surface of a GMR device is arranged relative to a magnet so that a magnetic field applied to the GMR device is changed in the amplitude range of 50~150 [Oe].

Figure 1:
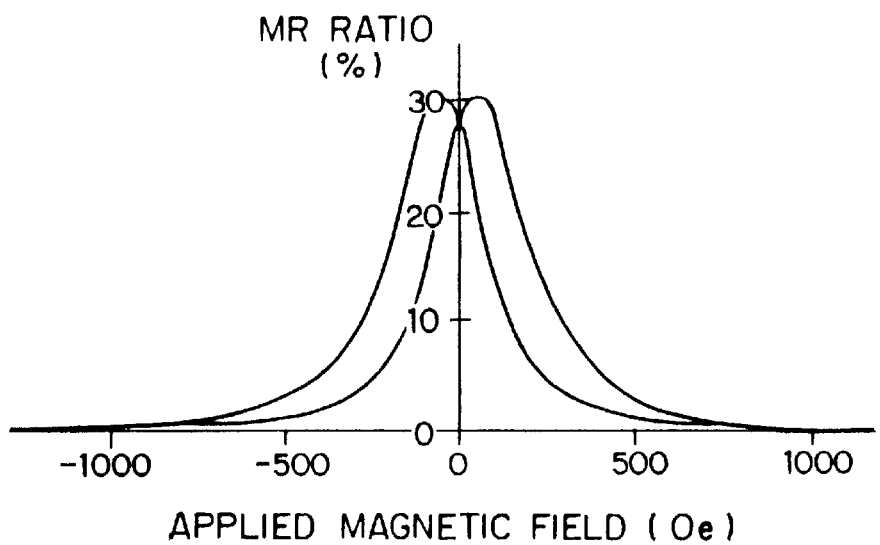
FIG. 1 is a graph showing an MR characteristic of a GMR device used in a magnetic detector according to the present invention resulted when a magnetic field of 0~±1000 [Oe] is applied.

A graph of FIG. 1 shows a resistance change rate (referred to as an MR ratio hereinafter) of a GMR device resulted when a magnetic field of 0~±1000 [Oe] is applied. As seen from the graph of FIG. 1, the GMR device has the so-called hysteresis characteristic. Here, t he MR ratio is expressed by:

$$MR\ ratio = \{(Rmax - Rmin)/Rmin\} \times 100[\%]$$

where Rmax is a maximum resistance value and Rmin is a minimum resistance value.

Figure 2:
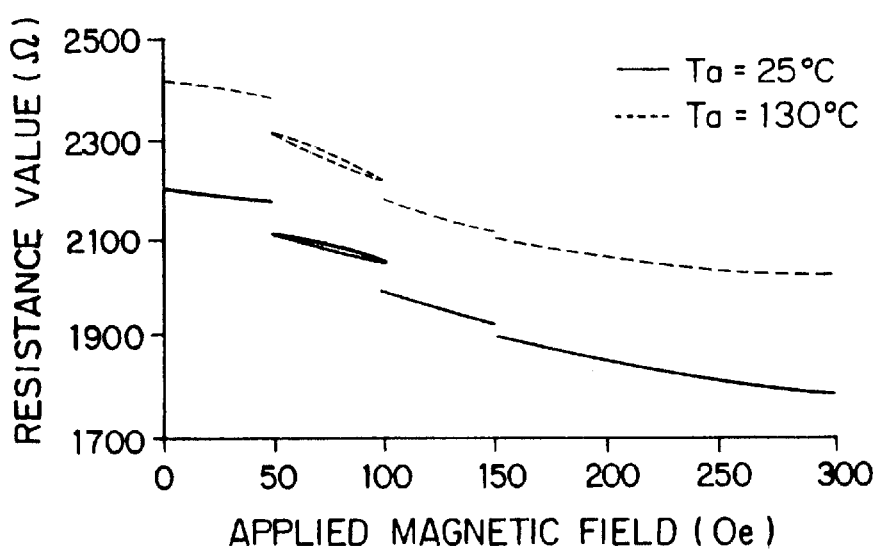
FIG. 2 is a graph showing a temperature characteristic of changes in resistance value of the GMR device used in the magnetic detector according to the present invention resulted when a magnetic field of 0~300 [Oe] is applied in steps of 50 [Oe].

A graph of FIG. 2 shows a temperature characteristic of changes in resistance value of the GMR device resulted when a magnetic field of 0~300 [Oe] is applied in steps of 50 [Oe], i.e., 0~50, 50~100, 100~150, 150~200, 200~250 and 250~300 [Oe], in consideration of that the applied magnetic field is changed corresponding to projections and recesses of the rotary member of magnetic material.

Note that, in the graph of FIG. 2, a solid line and a broken line represent temperature characteristics of changes in resistance value of the GMR device resulted when the ambient temperature Ta is 25° C. and 130° C., respectively.

Figure 3:
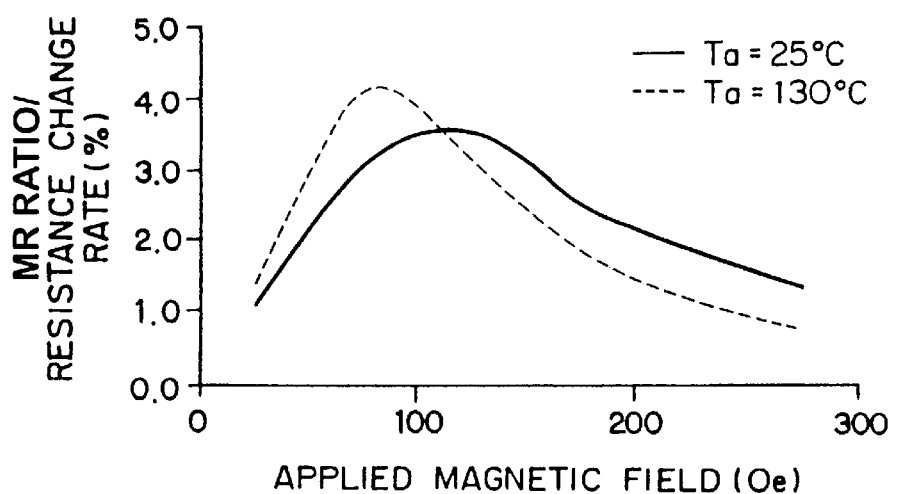
FIG. 3 is a graph showing a temperature characteristic of MR ratio of a GMR device in Embodiment 1 of the magnetic detector according to the present invention resulted when a magnetic field of 0~300 [Oe] is applied in steps of 50 [Oe].

A graph of FIG. 3 shows a temperature characteristic of MR ratio of the GMR device resulted when a magnetic field is applied in steps of 50 [Oe] as mentioned above.

As seen from the graph of FIG. 3, there is a point where the MR ratio of the GMR device is free from a temperature characteristic, specifically, in the graph of FIG. 3, a solid line and a broken line represent temperature characteristics of the MR ratio resulted when the ambient temperature Ta is 25° C. and 130° C., respectively. A point at which both the characteristic lines intersect provides the point where the MR ratio of the GMR device is free from a temperature characteristic. In the graph of FIG. 3, that point corresponds to the applied magnetic field of about 110 [Oe].

In this embodiment, therefore, the magnetoresistance pattern formed in the magnetic sensitive surface of the GMR device is arranged relative to the magnet, which serves as magnetic field generating means, so that a magnetic field applied to the GMR device is changed in the predetermined amplitude range around the above-mentioned 110 [Oe] where the temperature characteristic of the MR ratio is small, e.g., in the amplitude range of 50~150 [Oe].

Thus, according to this embodiment, by operating the GMR device under an applied magnetic field changing in the amplitude range of 50~150 [Oe] where the temperature characteristic of the MR ratio is small, it is possible to optimize the temperature characteristic of the GMR device and to improve noise resistance.

Embodiment 2

In above Embodiment 1, a magnetic field applied to a GMR device is set to change in the range of 50~150 [Oe]. By contrast, in this Embodiment 2, a bridge circuit is constituted by a plurality of magnetoresistance patterns of a GMR device. To this end, the GMR device is arranged relative to a magnet so that a first magnetoresistance pattern (which corresponds to a magnetoresistance pattern 3a in FIG. 4A) is subject to a magnetic field applied to change in the first predetermined amplitude range of, e.g., 50~150 [Oe], where a temperature characteristic of resistance change rate of the GMR device is small, while a second magnetoresistance pattern (which corresponds to a magnetoresistance pattern 3b in FIG. 4A) is subject to a magnetic field applied to change in the second predetermined amplitude range of, e.g., −150~−50 [Oe], where the temperature characteristic of resistance change rate of the GMR device is also small.

Figure 4A:
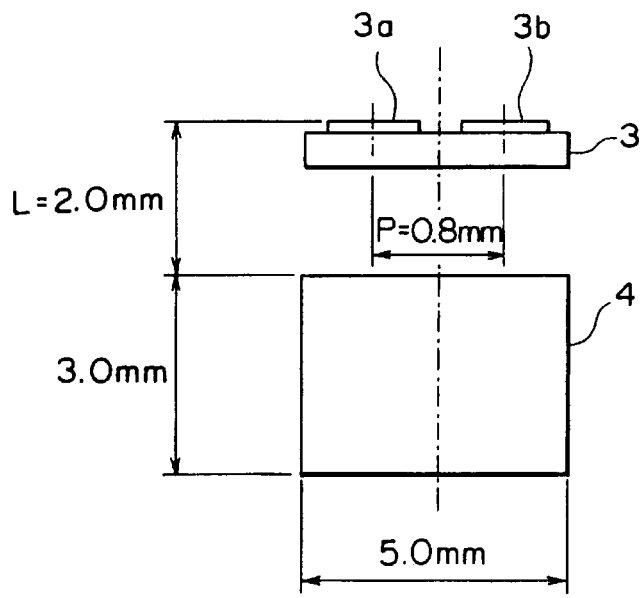
FIGS. 4A and B are a representation showing exemplified layout of Embodiment 2 of the magnetic detector according to the present invention.
Figure 4B:
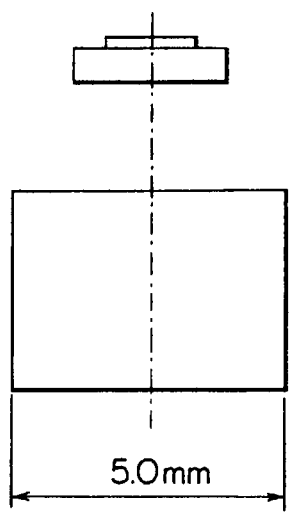

FIGS. 4A and 4B shows exemplified layout of Embodiment 2.

Figure 7A:
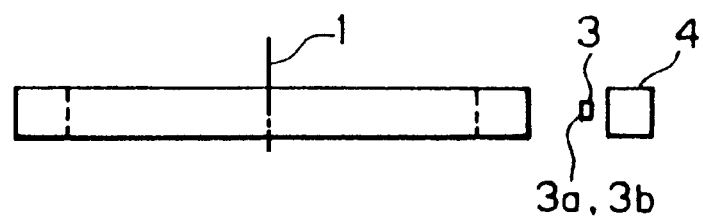
FIGS. 7A and 7B are a side view and a plan view, respectively, showing a construction of a conventional magnetic detector.
Figure 7B:
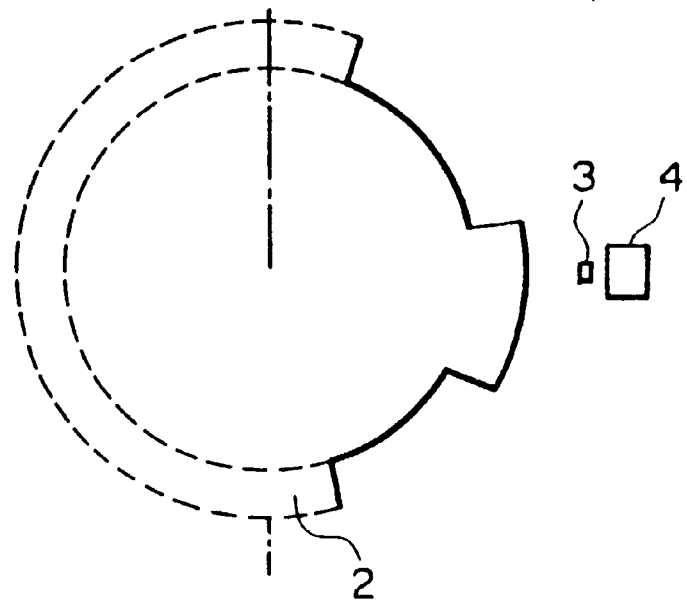

In FIGS. 4A and 4B, equivalent components to those in FIG. 7 are denoted by the same reference numerals, and the description thereof is omitted here.

As shown, by way of example, the magnet 4 is set to have dimensions of 5.0×5.0×3.0 mm, the distance from the magnet 4 to magnetic sensitive surfaces of the magnetoresistance patterns 3a, 3b of the GMR device 3 is set to L=2.0 mm, and the pitch P between the magnetoresistance patterns 3a, 3b is set to P=0.8 mm.

Figure 5:
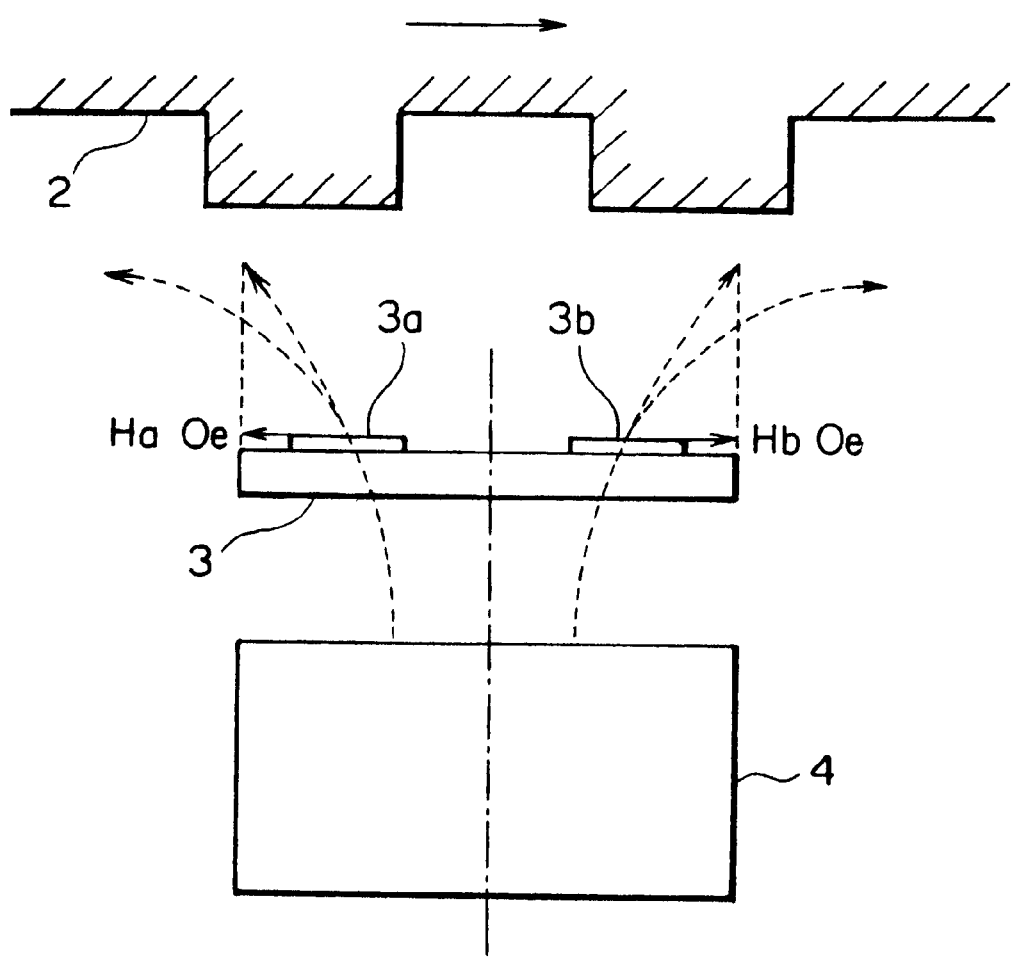
FIG. 5 is a representation showing vector directions of a magnetic field in Embodiment 2 of the magnetic detector according to the present invention.

FIG. 5 shows magnetic fields Ha, Hb which are applied to the magnetoresistance patterns 3a, 3b of the GMR device 3 in the direction along their magnetic sensitive surfaces in the layout of the magnet 4 and the GMR device 3 shown in FIG. 4 when the plate 2 is rotated.

The operation of Embodiment 2 will be described below with reference to FIG. 6.

Figure 8:
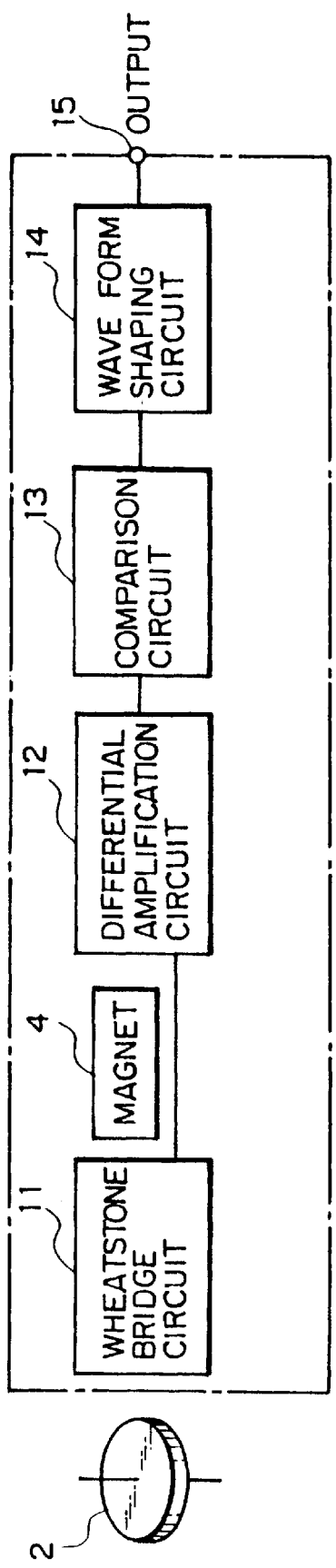
FIG. 8 is a block diagram schematically showing a circuit configuration of a conventional magnetic detector using GMR devices.
Figure 9:
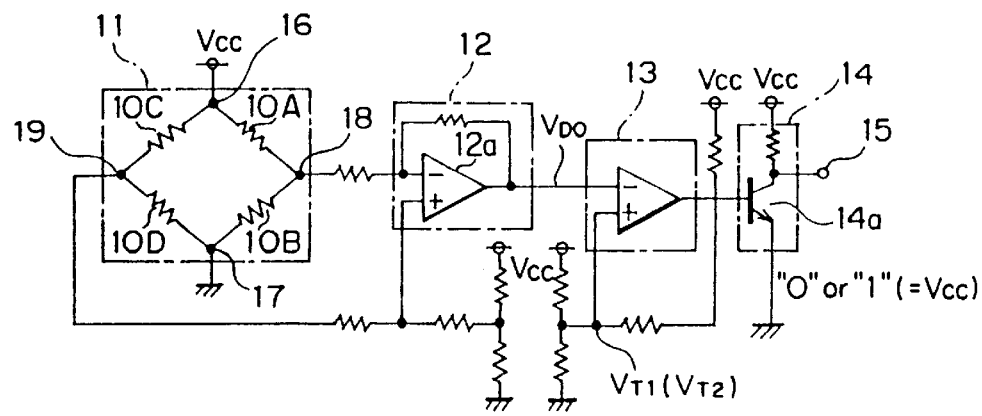
FIG. 9 is a circuit diagram showing one specific example of the circuit configuration represented by the block diagram of FIG. 8.
Figure 9:
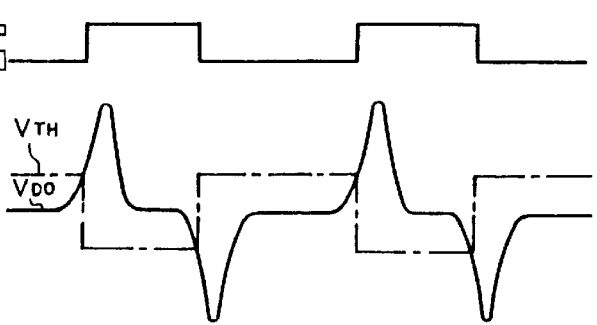
Figure 9:

A processing circuit used in Embodiment 2 may be configured as with the circuit diagram of FIG. 8, and hence is not described here in detail.

Figure 6A:
FIGS. 6A to 6D are waveform charts for explaining the operation of Embodiment 2 of the magnetic detector according to the present invention.
Figure 6B:
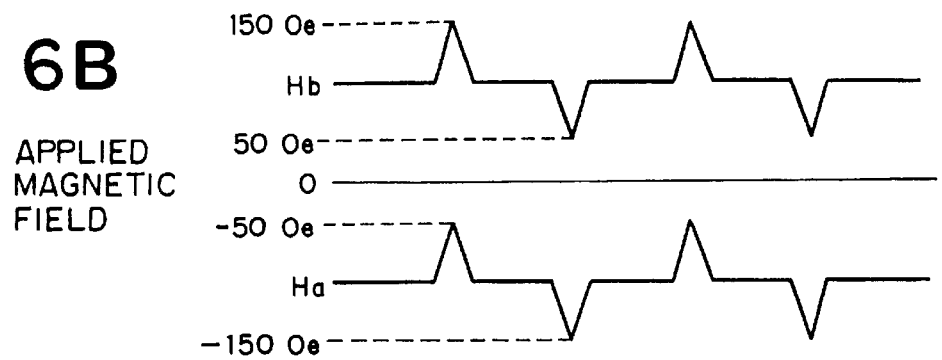

When the plate 2 rotates, magnetic fields of Ha=−50~−150 [Oe] and Hb=50~150 [Oe] shown in FIG. 6B are applied to the magnetoresistance patterns 3a, 3b of the GMR device 3, which constitutes the bridge circuit, corresponding to the projections and recesses of the plate 2 shown in FIG. 6A.

Figure 6C:
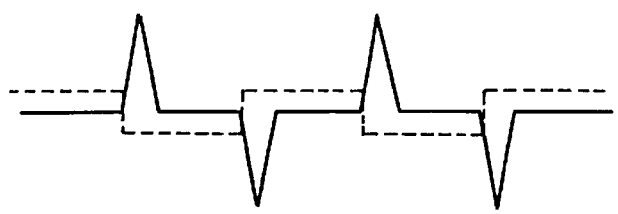
Figure 6D:

As a result, corresponding to the projections and recesses of the plate 2, there can be obtained a differential output of the GMR device 3 (i.e., output of the differential amplification circuit shown in FIG. 6C) and a final output (i.e., output of the waveform shaping circuit shown in FIG. 6D).

Consequently, since the GMR device can be used in an operating region where the temperature characteristic of the MR ratio is minimum, stable noise resistance can be achieved over the entire temperature range, and noise resistance at high temperatures, particularly, can be improved.

Thus, according to this embodiment, a bridge circuit is constituted by a first magnetoresistance pattern of a GMR device arranged to have such a predetermined gap relative to a magnet that the first magnetoresistance pattern operates under a magnetic field applied to change in the amplitude range of 50~150 [Oe], while a second magnetoresistance pattern of the GMR device arranged to have such a predetermined gap relative to the magnet that the second magnetoresistance pattern operates under a magnetic field applied to change in the predetermined amplitude range of −150~−50 [Oe]. Therefore, the GMR device can be used in an operating region where the temperature characteristic of the MR ratio is minimum. It is hence possible to achieve stable noise resistance over the entire temperature range, and to improve noise resistance, particularly, at high temperatures.

What is claimed is:

1. A magnetic detector comprising:

magnetic field generating means for generating a magnetic field, a rotary member of magnetic material arranged with a predetermined gap relative to said magnetic field generating means, and provided with projections capable of changing the magnetic field generated by said magnetic field generating means, and a giant magnetoresistance device of which resistance value is changed depending on the magnetic field changed by said rotary member of magnetic material, said giant magnetoresistance device being arranged between said magnetic field generating means and the periphery of the rotary member of magnetic material to have such a predetermined gap relative to said magnetic field generating means that said giant magnetoresistance device operates under a magnetic field applied to change in a predetermined amplitude range where a temperature characteristic of resistance change rate of said giant magnetoresistance device is small.

2. A magnetic detector according to claim 1, wherein the predetermined amplitude range of said applied magnetic field is 50~150 [Oe].

3. A magnetic detector according to claim 1, wherein said giant magnetoresistance has first and second magnetoresistance patterns to form a bridge circuit, said first magnetoresistance pattern being arranged to have such a predetermined gap relative to said magnetic field generating means that said first magnetoresistance pattern operates under a magnetic field applied to change in a first predetermined amplitude range where the temperature characteristic of resistance change rate of said giant magnetoresistance device is small, said second magnetoresistance pattern being arranged to have such a predetermined gap relative to said magnetic field generating means that said second magnetoresistance pattern operates under a magnetic field applied to change in a second predetermined amplitude range where the temperature characteristic of resistance change rate of said giant magnetoresistance device is small.

4. A magnetic detector according to claim 3, wherein the first predetermined amplitude range of said applied magnetic field is 50~150 [Oe], and the second predetermined amplitude range of said applied magnetic field is −150~−50 [Oe].

* * * * *